(12) United States Patent
Benzel et al.

(10) Patent No.: US 8,749,013 B2
(45) Date of Patent: Jun. 10, 2014

(54) SENSOR AND METHOD FOR ITS PRODUCTION

(75) Inventors: Hubert Benzel, Pliezhausen (DE); Simon Armbruster, Gomaringen (DE); Arnim Hoechst, Reutlingen (DE); Christoph Schelling, Stuttgart (DE); Ando Feyh, Tamm (DE)

(73) Assignee: Robert Bosch GmbH, Stuttgart (DE)

( * ) Notice: Subject to any disclaimer, the term of this patent is extended or adjusted under 35 U.S.C. 154(b) by 1272 days.

(21) Appl. No.: 12/302,677

(22) PCT Filed: Apr. 23, 2007

(86) PCT No.: PCT/EP2007/053932
§ 371 (c)(1),
(2), (4) Date: Sep. 23, 2010

(87) PCT Pub. No.: WO2007/147663
PCT Pub. Date: Dec. 27, 2007

(65) Prior Publication Data
US 2011/0002359 A1 Jan. 6, 2011

(30) Foreign Application Priority Data
Jun. 21, 2006 (DE) .......................... 10 2006 028 435

(51) Int. Cl.
*H01L 31/058* (2006.01)
(52) U.S. Cl.
USPC ........................................................ 257/467
(58) Field of Classification Search
USPC ................... 257/48, 414–470, 930
See application file for complete search history.

(56) References Cited

U.S. PATENT DOCUMENTS

| | | | |
|---|---|---|---|
| 5,596,219 A | 1/1997 | Hierold | |
| 2002/0190210 A1* | 12/2002 | Ishikawa et al. | 250/338.4 |
| 2004/0152228 A1 | 8/2004 | Benzel et al. | |
| 2005/0020007 A1* | 1/2005 | Weber et al. | 438/238 |
| 2005/0142687 A1* | 6/2005 | Benzel et al. | 438/53 |
| 2005/0224714 A1* | 10/2005 | Akin et al. | 250/332 |
| 2006/0063293 A1 | 3/2006 | Benzel et al. | |

FOREIGN PATENT DOCUMENTS

| | | |
|---|---|---|
| DE | 44 18 207 | 6/1995 |
| DE | 101 14 036 | 10/2002 |
| DE | 102 46 050 | 4/2004 |
| DE | 103 26 787 | 12/2004 |
| DE | 103 30 610 | 1/2005 |
| DE | 10 2004 036 035 | 7/2005 |
| DE | 10 2004 043 357 | 3/2006 |
| JP | 4-158583 | 6/1992 |

(Continued)

OTHER PUBLICATIONS

International Search Report, PCT/EP2007/053932, dated Sep. 20, 2007.

*Primary Examiner* — Anthony Ho
(74) *Attorney, Agent, or Firm* — Kenyon & Kenyon LLP (57) ABSTRACT

A sensor, in particular for the spatially resolved detection, includes a substrate, at least one micropatterned sensor element having an electric characteristic whose value varies as a function of the temperature, and at least one diaphragm above a cavity, the sensor element being disposed on the underside of the at least one diaphragm, and the sensor element being contacted via connecting lines, which extend within, on top of or underneath the diaphragm. In particular, a plurality of sensor elements may be formed as diode pixels within a monocrystalline layer formed by epitaxy. Suspension springs, which accommodate the individual sensor elements in elastic and insulating fashion, may be formed within the diaphragm.

19 Claims, 7 Drawing Sheets

(56) References Cited

FOREIGN PATENT DOCUMENTS

| JP | 11-177107 | 7/1999 |
| JP | 2001-281065 | 10/2001 |
| JP | 2002-148111 | 5/2002 |
| JP | 2004-93535 | 3/2004 |
| JP | 2005-9998 | 1/2005 |
| JP | 2006-194784 | 7/2006 |
| WO | WO 03/011747 | 2/2003 |

* cited by examiner

SENSOR AND METHOD FOR ITS PRODUCTION

FIELD OF THE INVENTION

The present invention relates to a sensor, in particular for the spatially resolved detection, and to a method for its production.

BACKGROUND INFORMATION

DE 101 14 036 describes a method for producing micropatterned sensors, in which openings are introduced into a semiconductor substrate, which transform themselves into cavities underneath a sealed diaphragm cover in the depth of the substrate in a subsequent thermal treatment. This makes it possible to produce a capacitive pressure sensor, the cavity in the substrate being developed between two doping zones, which form a plate-type capacitor having a capacitance as a function of the spacing of the doping zones. The doping zones are connected to a corresponding evaluation circuit by deep contacting.

DE 10 2004 043 357 describes a method for producing a cavity in a semiconductor substrate, in which a lattice-type structure on the surface of the substrate is first produced from substrate material not rendered porous, between which or underneath which a porous region is subsequently formed into the depth of the semiconductor substrate. The porosified region is relocated into a cavity by a subsequent thermal treatment, the lattice-like structure being developed into a diaphragm or into part of a diaphragm above the cavity, if appropriate.

However, such production methods often do not allow the development of more complex sensors having high resolution and low noise.

SUMMARY

In contrast, the micropatterned sensor according to example embodiments of the present invention and the method for its production have a number of advantages. At least one, preferably several sensor elements that are laterally set apart are formed within a substrate, each being suspended underneath a diaphragm made of dielectric material. The sensor elements may be diodes, in particular, but basically also transistors, for example. Important is that the individual sensor elements have a temperature-dependent electric characteristic whose values are able to be read out via lead wires.

The individual sensor elements are suspended in one or several cavities formed underneath the diaphragm. In this context, a separate cavity may be provided for each sensor element, or several or all of the sensor elements may be disposed within one shared cavity.

The individual sensor elements are contacted via lead wires, which run within, on top of or underneath the diaphragm. The diaphragm may be patterned such that it forms individual suspension springs, which link each sensor element to the surrounding mainland or to surrounding webs of an epitaxy layer formed on top of or above the substrate.

According to an example embodiment, reinforcements, specifically LOCOS (local oxidation of silicon) reinforcements produced by local oxidation, are formed in the dielectric layer constituting the diaphragm, which increase the mechanical stability considerably. The reinforcements may be formed especially at the lateral edge of the diaphragm, so that they surround the particular sensor element; furthermore, they may extend at the lateral edge of the mainland or the remaining webs supporting the sensor elements and thereby accommodate the suspension springs with high stability. The ultimate tensile strength of the suspension springs at the sensor elements and the mainland or the remaining webs is able to be increased in this manner.

Because of the diaphragm, in particular because of the suspension springs in the diaphragm, excellent thermal decoupling of the sensor elements with respect to each other and the mainland is achieved. Developing the sensor elements in an epitaxial and thus monocrystalline layer makes it possible to keep the signal noise very low. This is advantageous in particular when forming diodes or transistors.

Thus, a component array having high resolution or a high number of sensor elements and low noise is formed, which may have a mechanically very sturdy design. The individual lead wires to the sensor elements can be connected to shared lead wires, so that the individual components may be read out via successive addressing. Due to the high integration, the power requirement is low.

In particular, this makes it possible to produce a diode array for the spatially resolved temperature measurement and/or for the spectroscopic measurement of a gas concentration. Another field of application is a fingerprint sensor.

According to an example embodiment, the sensor not only includes the detector region having the sensor elements but, laterally adjacent and advantageously isolated therefrom, a circuit region including additional components to evaluate the signals output by the sensor elements. At least a few of the process steps of forming the sensor elements of the detector region may also be utilized to produce the circuit region, so that a rapid and cost-effective production is possible. Thus, a MEMS (micro electro mechanical system) component having a combined sensor system and electronic evaluation circuit is able to be formed on one chip.

The production may be implemented entirely by surface-micromechanical process steps, so that only one surface needs to be processed. The production may be implemented at the level of the wafer with subsequent sectioning.

To begin with, a first region of the doped substrate (or a doped layer formed on the substrate) is rendered porous for the production, a lattice-like structure and a second region surrounding the first region first being protected from the subsequent etching process by suitable doping. Thus, the first region underneath the lattice-type structure may subsequently be rendered selectively porous in electrolytic manner; if appropriate, complete removal of the material in this region is also possible already. An epitaxial layer may then be grown on the lattice-like structure and the surrounding mainland, annealing of the porous region being implemented during the growing process (or possibly also in an additional step) while forming a cavity.

Thus, an epitaxial monocrystalline layer in which the sensor elements are subsequently developed by additional process steps, e.g., by doping corresponding diode regions, may be formed above the cavity. Since the sensor elements are developed in the monolithic epitaxial layer, they exhibit low signal noise. The cavity already thermally insulates them from the substrate.

Further insulation is achieved by developing a diaphragm underneath which the sensor elements are suspended. To this end, one (or several) dielectric layer(s) is/are applied on the epitaxy layer and then patterned. In particular, the dielectric layer may be formed by oxidation or deposition of an oxide layer, formation of etching accesses through the dielectric layer and the epitaxy layer, as well as subsequent sacrificial layer etching of the epitaxy layer. The at least one dielectric layer thus forms a diaphragm, which is self-supporting above the cavity and accommodates the particular sensor element in thermally and mechanically decoupled manner. Further thermal decoupling may be achieved by patterning suspension springs in the diaphragm, thereby making it possible to route the electrical lead wires to the sensor elements via the suspension springs.

Example embodiments of the present invention are explained in greater in the following text with the aid of the accompanying drawing.

BRIEF DESCRIPTION OF THE DRAWINGS

FIG. 1a illustrates a preliminary circuit process and a process step for developing a lattice structure in the detector region;

FIG. 1b illustrates the process step of an n-layer epitaxy;

FIG. 1c illustrates the process steps of the implantation or diffusion in the circuit region, production of dielectric layers, and patterning of the contact holes in the dielectric layers;

FIG. 1d illustrates the back end circuit process with the development of a full-area metal cover of the diaphragm, and of passivation layers in the circuit region;

FIG. 1e illustrates the process steps of removing the layer stack above the first metallization layer, patterning the metallization in the region of the diode pixels, and opening sacrificial-layer etching accesses, or suspension springs in the remaining dielectric layer;

FIG. 1f illustrates the isotropic sacrifical layer etching to expose the diode pixel;

DETAILED DESCRIPTION

In the production process, a detector region 2 and, laterally spaced apart or abutting, a circuit region 3 are formed on a p-semiconductor substrate 1, e.g., p-doped (100) silicon; the development of the two regions 2, 3 is able to be fully or partially combined in the subsequent process steps.

According to FIGS. 1a through 1f, both the circuit region 3 and detector region 2 are implemented in surface-micromechanical manner from the top surface of p-substrate 1. To this end, preliminary circuit processes to form circuit region 3 may be implemented to begin with. Process steps for forming circuit region 3 may also be added between the subsequent process steps 1a through 1f. In an advantageous manner, one or several of the following process steps for developing detector region 3 is/are simultaneously utilized to produce circuit region 3.

Figure 1A:
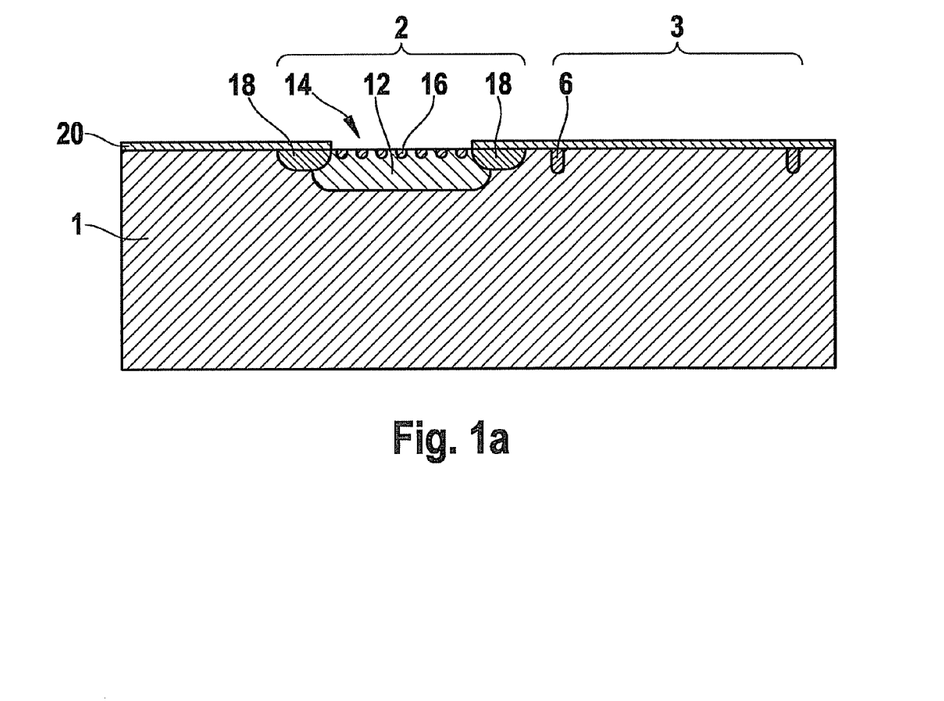
FIG. 1a through 1f illustrate the process steps of the production of a micromechanical sensor according to an example embodiment, exemplarily for one diode pixel of the sensor.

Using $p^+$ doping, for example, a lower iso-layer 6, which has the shape of a trough in cross section, may be formed in p-substrate 1 between detector region 2 and circuit region 3, lower iso-layer 6 being supplemented toward the top in a later process step and utilized to insulate detector region 2 from circuit region 3.

For each sensor element to be produced, a first region 12 is rendered porous in detector region 2, a lattice-like structure 14 having lattice webs 16 remaining on the surface of first region 12. In the lateral region, first region 12 is advantageously delimited by an annular second region 18. First region 12 and second region 18 are doped to different extents, especially by a different type of charge carrier. First region 12 is p-doped, for example, that is to say, it may be formed directly out of p-substrate 1 in particular, and second region 18 is $n^+$-(or also n-)doped. In principle, first region 12 may also be completely removed already so that a free space remains as "100% porosity" underneath lattice-type structure 14.

The production of this array of a porosified first region 12, a surrounding second region 18, and a spared lattice-type structure 14 is described in DE 10 2004 036 035 as well as DE 100 32 579, for example, to which reference is made here for individual details. Second region 18 is produced at the lateral edge of first region 12, for instance by redoping, such as with the aid of implantation and/or diffusion methods. Furthermore, lattice-type structure 14 having lattice webs 16 is formed by n-doping, and lower iso-layer 6 is formed by $p^+$-doping. These designs of second region 18, lattice-like structure 14, and lower iso-layer 6 is realizable with the aid of, for example, resist masks prior to the further process steps, i.e., also prior to the etching.

Subsequently, an etching mask 20 of SiO2 and/or Si3N4, for example, is deposited on detector region 2 and circuit region 3 and patterned such that first region 12 having lattice-like structure 14 is spared. Only then will first region 12 be rendered porous by electrochemical etching in an electrolyte containing hydrofluoric acid. A spreading agent such as isopropanol, ethanol, or a tenside may be added in order to reduce the surface tension. Depending on the substrate doping and the desired micropattern, the concentration of hydrofluoric acid may range from 10 to 50%. The porosity of first region 12 is adjustable by the selected current density.

Lattice webs 16 and annular, $n^+$-doped second region 18 are not attacked by the electrochemical etching process since holes (defect electrons) are required for the dissolution process of silicon, of which a sufficient number is available in the p-silicon but not in the n-Si. Second region 18 therefore delimits first region 12 in the lateral direction, and the depth of first region 12 is defined by the etching duration and current intensity.

According to FIG. 1b, an n-epi layer 24 is subsequently deposited or grown on p-substrate 1 epitaxially, such layer extending across detector region 2 and circuit region 3. During this epitaxial growth process, annealing of porous first region 12 also takes place, which leads to thermal relocation of the porous material and thus to the formation of a cavity 26 underneath n-epi layer 24. In the process, a monocrystalline layer precipitates from the porous material and deposits on the walls of cavity 26. Lattice webs 16 relocate to form, for example, a monocrystalline layer 28 between cavity 26 and n-epi layer 24. This annealing step may be implemented at approximately 900 to 1200° C., for example. The formation of a cavity 26 out of a porous region is described in DE 10 2004 036 035, for instance.

According to example embodiments of the present invention, larger-area regions may optionally remain in lattice-type structure 14, so that only a weak porosification takes place underneath them, i.e., merely by lateral etching. These more weakly porosified regions may form temporary support points 30 inside cavity 26 during annealing, which thus support layer 28 and n-epi layer 24 above cavity 26.

According to FIG. 1c, suitable structures are subsequently developed within and/or on top of n-epi layer 24, which may be implemented both in detector region 2 and also in circuit region 3. Different implantation- or diffusion-process steps for developing the circuits may be utilized in circuit region 3 in a manner known per se. An n+-region 32 and a p+-region 34 are formed in detector region 2 in n-epi layer 24 for each future pixel via implantation and/or diffusion. N-epi layer 24 together with p+-region 34 forms a diode in the process. Furthermore, one or a plurality of dielectric layer(s) 36 is/are developed, e.g., by oxidation to SiO2, locally thicker LOCOS reinforcement regions 38 being developed at least in detector region 2 by a LOCOS method. To this end, stronger oxidation accompanied by a corresponding increase in volume and thus thickening in the vertical direction are obtained in SiO2 layer 36 by suitable masking. LOCOS reinforcement regions 38 are formed at the edge of the future pixels in particular, i.e., above the edges of cavity 26. Corresponding LOCOS reinforcement regions 38 may also be formed in circuit region 3.

Furthermore, the one or the several dielectric layer(s) 36 is/are patterned in circuit region 3 and in detector region 2. In so doing, access holes 40, 42 for the subsequent contacting are patterned above n+-region 32 and p+-region 34. Different components 44, for example, are patterned in circuit region 3. LOCOS reinforcements 38 may be formed here as well.

Figure 1B:
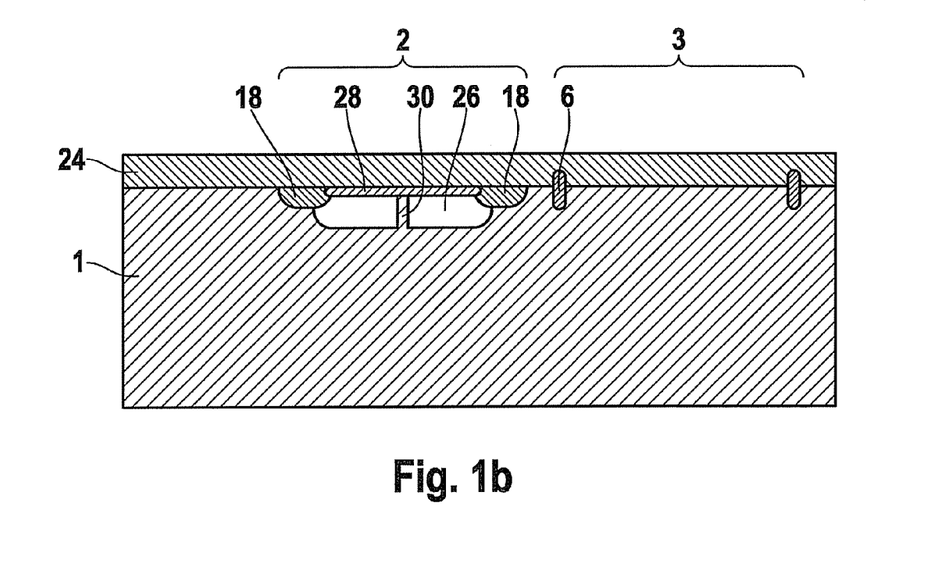
Figure 1C:
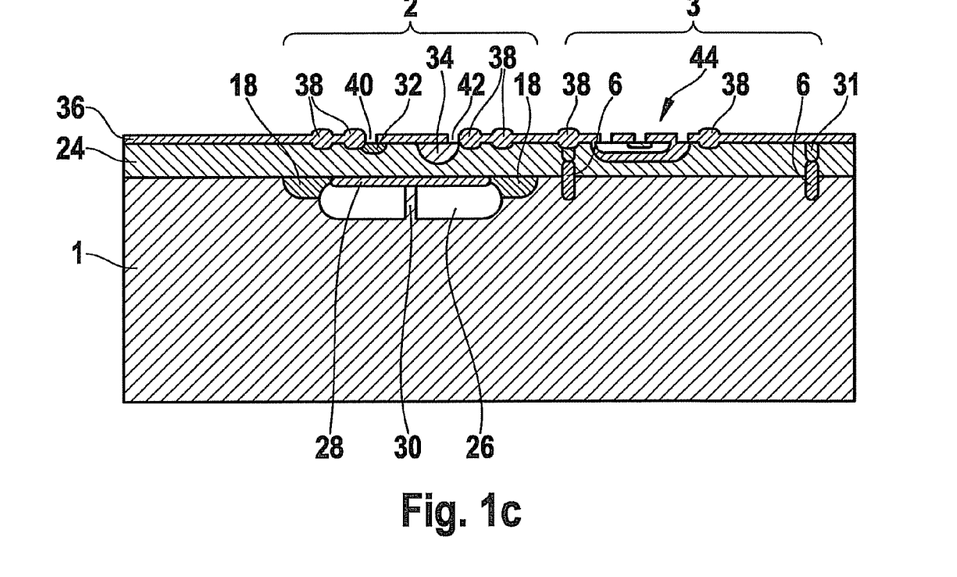
Figure 1D:
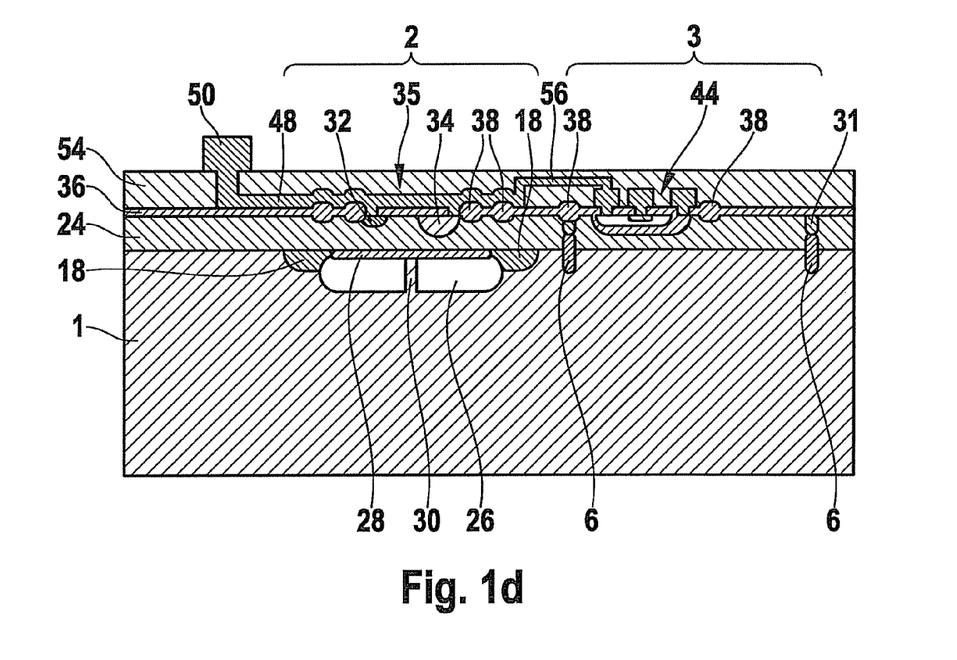

According to FIG. 1d, metallizations and passivations, e.g., a metallization layer 48 including contact pad 50, and one or a plurality of passivation layer(s) 54 are applied in a backend circuit process. Metallization layer 48 of Al, for example, contacts n+-region 32 and p+-region 34 in cut-out access holes 40, 42 of dielectric layer 36. Metallization layer 48 is utilized accordingly also in circuit region 3 for contacting the components 44 formed there, for supply lines and possibly also for components. Metallization layer 48 advantageously also forms connecting lines 56 between detector region 2 and circuit region 3 so that an integrated component is produced, which has a detector region 2 and a circuit region 3.

One or a plurality of metallization layer(s) 50 made of, e.g., Al may be developed in the process. N+-region 32 is provided merely for contact with metallization layer 50 so that no Schottky contact occurs between the metal and the heavily doped region. Actual diode 35 is formed between n-epi layer 24 and p+-region 34, which because of its heavy doping likewise does not cause any Schottky contact with metallization layer 50. As can be gathered from FIG. 1d, n-epi layer 24 is able to be insulated from circuit region 3 in the lateral direction by an upper iso-layer 31 and, above this, by a LOCOS reinforcement 38.

The one or the plurality of metallization layer(s) 48 is/are also used to prevent the deposition of the one or the plurality of passivation layer(s) 54 above diode 35.

Passivation layer 54 is subsequently removed above diode 35, metallization layer 48 serving as etching stop. Metallization layer 48 is then suitably patterned above diode 35, so that only n+-region 32 and p+-region 34 are contacted by connecting lines 60, 62, as can be gathered from the plan view of FIG. 3 (the additional patterning of FIG. 3 takes place only subsequently).

Figure 1E:
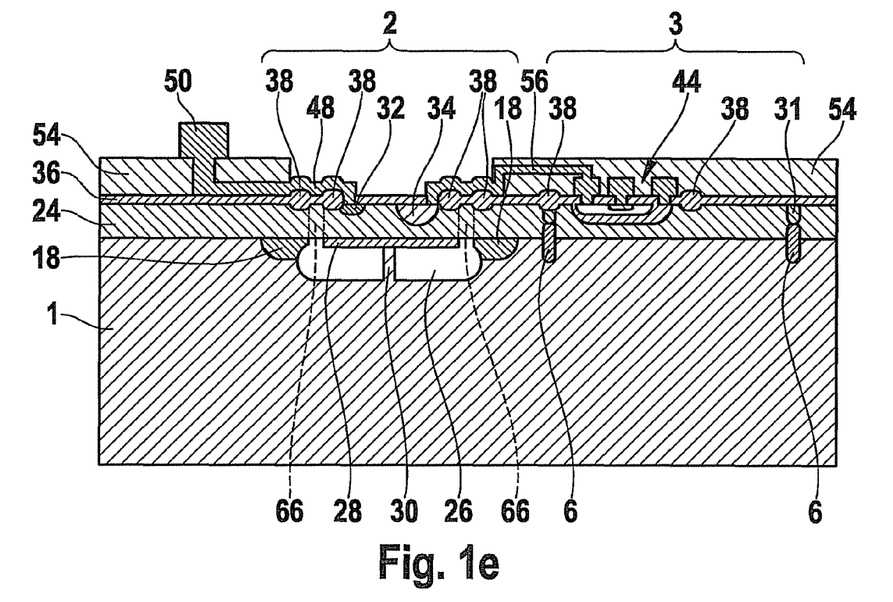

Furthermore, according to FIG. 1e, sacrificial-layer etching accesses 66 are opened in n-epi layer 24, preferably by reactive ion etching through n-epi layer 24. A BRIE method may be used for this purpose or, since the n-epi layer has a thickness of only a few μm, for example, a conventional reactive ion etching method, such as a Bosch etching method, as well. In the process, sacrificial-layer etching accesses 66 are produced in n-epi layer 24, which forms the preliminary diaphragm. Sacrificial-layer etching accesses 66 are already visible in the plan view of FIG. 3, although connecting lines 60, 62 are not yet undercut by etching. According to FIG. 1f, this takes place in a subsequent isotropic sacrificial-layer etching step using ClF3, XeF2, for example, or some other etching gas that selectively etches silicon, until the monocrystalline region of diode pixel 52 has been exposed by etching. A portion of the one or the plurality of dielectric layer(s) 36 is undercut by etching with the aid of the sacrificial-layer etching and exposed as diaphragm 36.1 in this way. Patterned diaphragm 36.1 forms elastic suspension springs 70 on which connecting lines 60, 62 to n+-doped region 32 and to p+-doped region 34 extend as well.

Figure 1F:
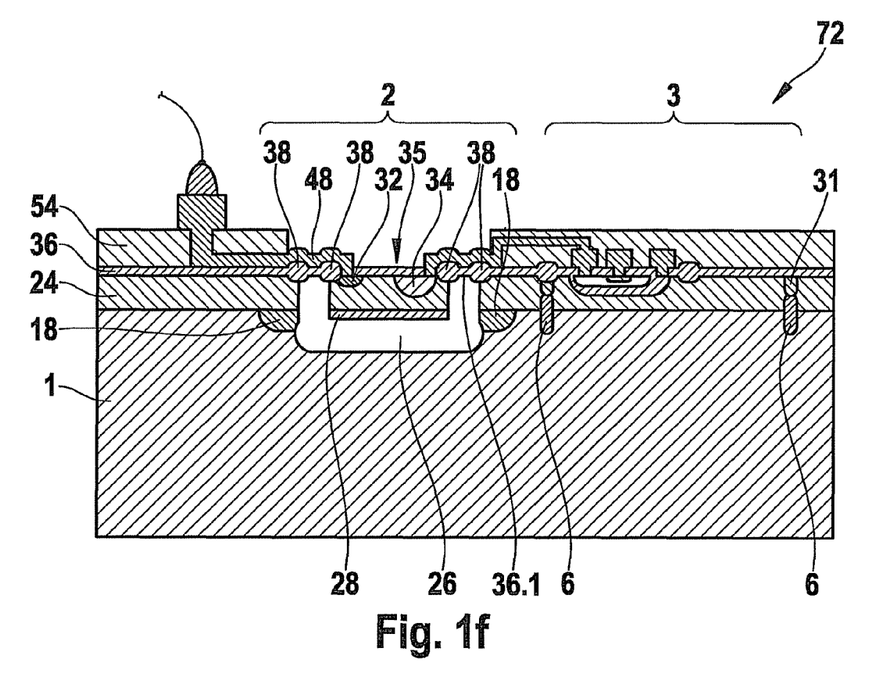

If temporary supports 30 are formed according to FIG. 1b, then they will be removed as well during the underetching according to FIG. 1f.

Diode pixel 52 is therefore supported by the, e.g., four suspension springs 70, which hang freely now, LOCOS reinforcements 38 being formed in suspension springs 70 or at the transition of suspension springs 70 to the mainland. As a result, individual diode pixels 52 are thermally well insulated from one another and from the remaining mainland via suspension springs 70 made of the insulating SiO2.

Figure 3:
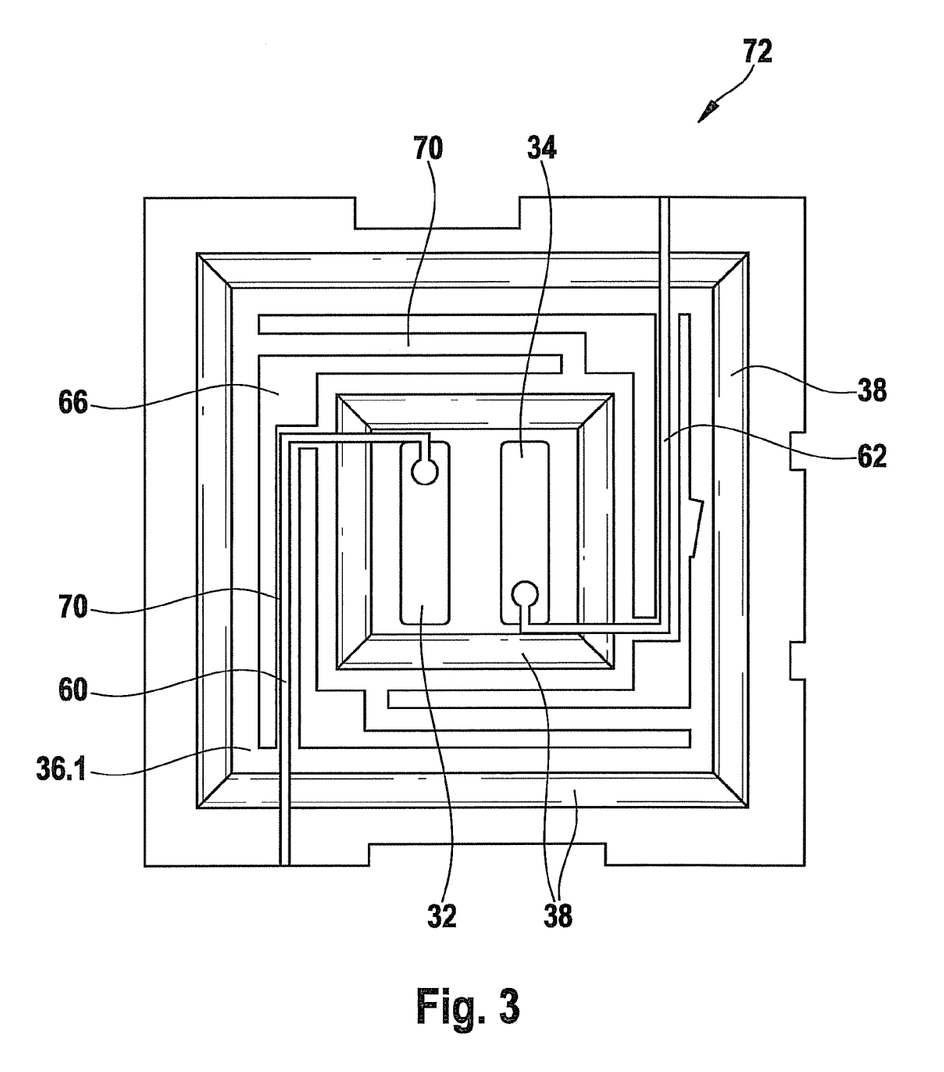
FIG. 3 illustrates a plan view of a finished diode pixel according to FIG. 1f or FIG. 2.

Diode pixel 52 shown in FIG. 3 may be used for direct temperature sensing, in particular. In addition, an absorption material for absorbing IR radiation may be applied on diode pixel 52.

The precise design of LOCOS reinforcement 38 may be selected according to the particular mechanical requirements; according to the plan view of FIG. 3, it is possible, in particular, to provide an annular reinforcement at the inner end of suspension springs 70, i.e., at the outer end of diode pixel 52, and at the outer edge of suspension springs 70, i.e., in the connection to the mainland. In this manner, two concentric, annular or rectangular LOCOS reinforcements 38 and 38 are formed.

FIG. 1f and, in a plan view, FIG. 3 therefore show finished sensor 72, which as a rule includes a plurality of diode pixels 52 and circuit region 3 having a suitable evaluation circuit.

Figure 2:
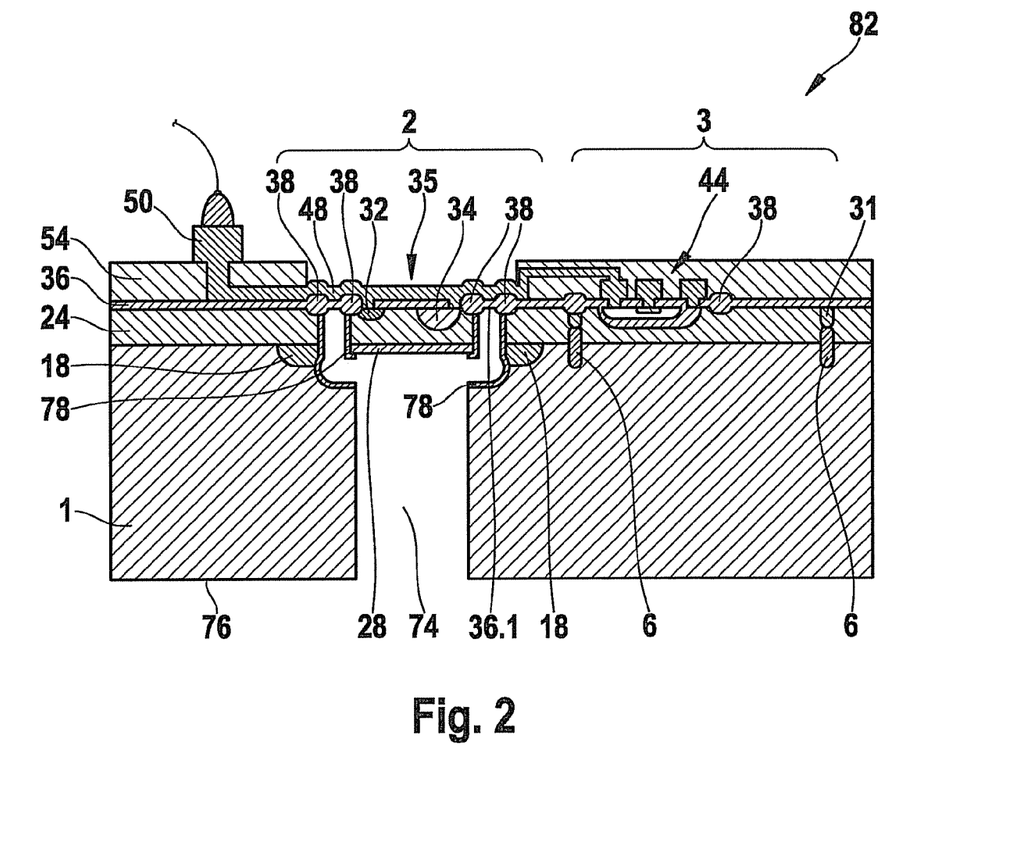
FIG. 2 illustrates an example embodiment as an alternative to FIG. 1f with retroactive formation of a cavity from the rear side.

In the example embodiment of FIG. 2 as an alternative to that in FIG. 1f, a cavity 74 is formed from rear side 76 of p-substrate 1 or the entire wafer in addition. To this end, a bulk etching process may be implemented from rear side 76 of p-substrate 1. To protect the structures of diode pixel 52, proceeding from FIG. 1f, an oxide layer 78 may first be formed at the boundary surfaces of all structures as first process step, i.e., at p-substrate 1, n-epi layer 24, both in the mainland region and at diode pixel 52, and furthermore at second region 18 having n+-doping. This oxidation of the silicon to SiO2 may therefore first be implemented from the direction of the front side, whereupon a deep-trenching etching process is then carried out from rear side 76 of p-substrate 1, and cavity 74 is formed, which thus is situated underneath individual diode pixel 52.

Cavity 74 may thereupon be sealed using a suitable material, e.g., a material having low thermal conductivity. With the exception of additional cavity 74 underneath diode pixel 52, sensor 82 of FIG. 2 therefore corresponds to sensor 72 shown in FIG. 1f.

Figure 4:
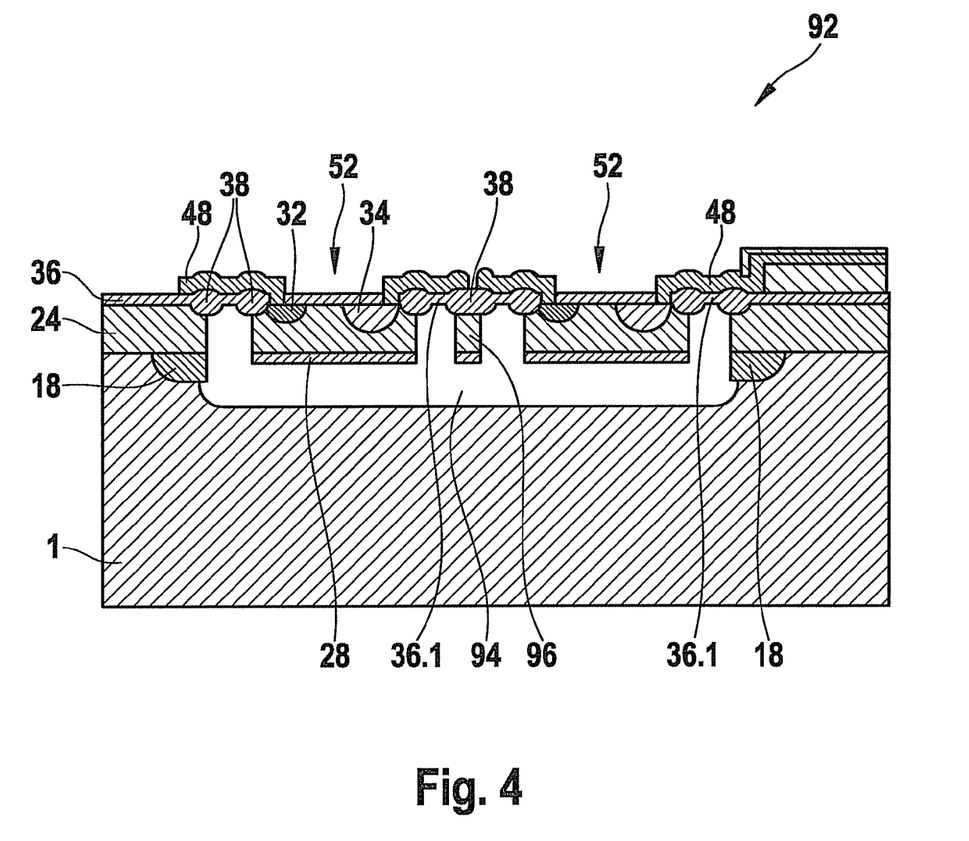
FIG. 4 illustrates a cross section through a sensor having a plurality of diode pixels and continuous, shared free space.

FIG. 4 shows an additional example embodiment of a sensor 92, which basically corresponds to sensor 72 of the first specific embodiment according to FIGS. 1f, 3; however, instead of a plurality of separate cavities 26 being developed underneath the plurality of diode pixels 52, only one continuous cavity 94 is formed, which therefore surrounds all of the diode pixels 52 or a number of diode pixels 52. In contrast to the first example embodiment, the support of diaphragm 36.1 in p-substrate 1 is therefore omitted. However, webs 96 from n-epi layer 24 remain between individual diode pixels 52 and are not etched off, these webs 96 or the lattice-type structure formed thereby being utilized for heat dissipation. During operation, the plurality of diode pixels 52 initially heat up slightly, and the heat they generate is output in lateral direction to webs 96 via diaphragm 36.1 formed from dielectric layer 36, the silicon material of webs 96 having high thermal conductivity. As a result, it is possible to dissipate the heat generated in individual diode pixels 52 to the outside in the lateral direction. In the specific embodiment of FIG. 4, a single continuous cavity 94 is therefore produced, at whose underside individual diode pixels 52, which were formed out of n-epi layer 24, are suspended.

Figure 5:
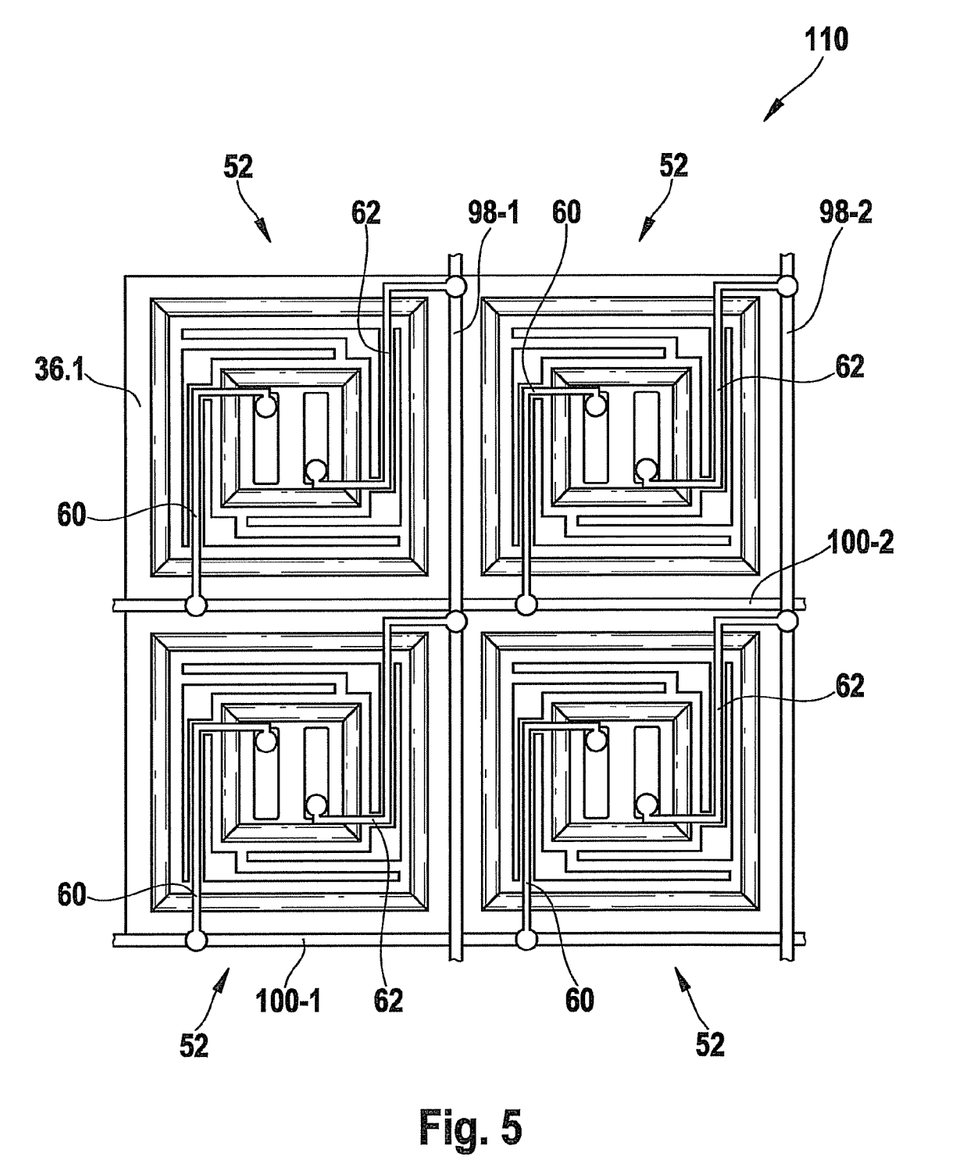
FIG. 5 illustrates a plan view of the sensor of FIG. 4 having a plurality of diode pixels.

FIG. 5 shows a plan view of a diode array made up of four diode pixels 52. Connecting lines 60, 62 of each diode pixel 52 may be connected to shared connecting lines 98, 100; as a result, (cathode) connecting lines 60 contacting the particular $n^+$-region 32, are connected to a shared cathode connecting line 100-1, 100-2, . . . , and (anode) connecting lines 62 contacting the particular $p^+$-region 34 are connected to one or a plurality of shared anode connecting line(s) 98-1, 98-2, . . . . The individual diode pixels 52 are therefore able to be read out via corresponding addressing of shared connecting lines 98-1, 98-2, . . . , as well as 100-1, 100-2.

Given such an array, it is therefore possible to form a complex diode array 110 having relatively few connecting lines. When forming a larger cavity 94 according to FIG. 4, shared connecting lines 98-1, 98-2, . . . , 100-1, 100-2, . . . , may be applied on diaphragm 36.1 above webs 96; contacting of connecting lines 98-1, 98-2, . . . , 100-1, 100-2, . . . at the points of intersection is prevented by a corresponding insulation layer.

What is claimed is:

1. A sensor, comprising:
   a substrate;
   a plurality of micropatterned sensor elements arranged as diode pixels, each micropatterned sensor element having an electric characteristic, a value of the electric characteristic varying as a function of temperature; and
   a plurality of diaphragms each arranged above a cavity, wherein each diaphragm includes an oxide layer;
   wherein the micropatterned sensor elements are arranged on an underside of the diaphragms;
   wherein the sensor elements are contacted via connecting lines that extend at least one of (a) within, (b) on top of, and (c) underneath the diaphragms;
   wherein the micropatterned sensor elements include a monocrystalline layer formed on the underside of the diaphragms, the monocrystalline layer directly contacting the oxide layer, the monocrystalline layer having at least one pn-transition between a positively doped region and a negatively doped region; and
   wherein the diaphragms include suspension springs arranged as web-like regions in the diaphragms, and the sensor elements are suspended at the suspension springs.

2. The sensor according to claim 1, wherein each of the micropatterned sensor elements has an $n^+$-doped region contacted by a first connecting line and a $p^+$-doped region contacted by a second connecting line arranged within the monocrystalline layer.

3. The sensor according to claim 1, wherein the oxide layer of each of the diaphragms includes at least one reinforcement region.

4. The sensor according to claim 3, wherein the at least one reinforcement region is formed at least one of (a) a lateral edge of one of the sensor elements, (b) a lateral edge of a mainland surrounding the cavity, and (c) a lateral edge of webs extending between two of the sensor elements.

5. The sensor according to claim 1, wherein the connecting lines to the sensor elements extend at least one of (a) on top of, (b) within, and (c) underneath the suspension springs.

6. The sensor according to claim 1, wherein the cavity is formed in the substrate and delimited in a downward direction.

7. The sensor according to claim 1, wherein the cavity extends to a rear side of the substrate.

8. The sensor according to claim 1, wherein a shared cavity is arranged at least one of (a) underneath a plurality and (b) underneath all of the sensor elements.

9. The sensor according to claim 1, wherein the connecting lines of each sensor element are contacted at shared connecting lines, and each sensor element is able to be read out successively by at least one of (a) addressing and (b) reading out a pair of shared connecting lines.

10. The sensor according to claim 1, wherein each one of the micropatterned sensor elements defines a detector region, and a circuit region is provided on top of the substrate for each detector region, and wherein each circuit region has components for accommodating and processing measuring signals output by a corresponding detector region.

11. The sensor according to claim 10, wherein the detector region and the circuit region are formed in at least partly the same layers.

12. The sensor according to claim 1, wherein the sensor is at least one of (I) adapted for at least one of (a) spatially resolved detection and (b) spatially resolved measurement of at least one of (i) temperature, (ii) radiation, and (iii) a finger print and (II) arranged a sensor for detecting a gas concentration.

13. A method for producing a sensor that includes at least one micropatterned sensor element having an electric characteristic whose value varies as a function of temperature, comprising:
   forming a lattice-like structure on a topside of a substrate or a layer formed on the substrate;
   electrochemical etching of a first region underneath the lattice-like structure while forming porous material or a free space;
   depositing an epitaxial layer on the substrate or a layer covering the substrate, the epitaxial layer being formed on the lattice-like structure over an entire area, and a first region forming a cavity underneath the lattice-like structure;
   arranging the at least one sensor element within or on top of the epitaxial layer;
   depositing at least one dielectric layer on the epitaxial layer prior to, during, or following patterning of the epitaxial layer;
   contacting the sensor element via connecting lines formed within at least one conductive layer;
   exposing etching accesses to the cavity through the at least one dielectric layer and the epitaxial layer, the at least one dielectric layer being patterned such that the connecting lines extend on remaining regions of the dielectric layer; and
   sacrificial-layer etching of the epitaxial layer and exposing the at least one dielectric layer around the at least one sensor element, as a diaphragm.

14. The method according to claim 13, wherein, in the forming, a second region surrounding the first region is first formed by a charge-carrier type that is opposite of the first region, and, in the electrochemical etching, the first region is rendered porous or removed completely by an electrolytic etching process while retaining the second region as a lateral delimitation, and if the first region is rendered porous and incompletely removed in the electrochemical etching, annealing of the first region takes place in the depositing of the epitaxial layer in order to produce the cavity underneath the epitaxial layer.

15. The method according to claim 13, wherein the at least one dielectric layer is formed as an oxide on top of the epitaxial layer, and reinforcements having greater thickness to increase a mechanical stability are formed by local oxidation in the at least one dielectric layer in a region of the diaphragm.

16. The method according to claim 15, wherein the reinforcements are formed peripherally at least one of (a) at a lateral edge of the sensor elements, (b) at a lateral edge of a mainland surrounding the sensor element, and (c) at a lateral edge of a lattice made up of webs and surrounding the sensor element.

17. The method according to claim 13, wherein a second cavity is formed from a rear side of the substrate up to the cavity formed underneath the epitaxial layer.

18. The method according to claim 13, wherein at least one component is formed in a circuit region of the sensor.

19. The method according to claim 13, wherein the sensor is arranged as the sensor according to claim 1.

* * * * *